United States Patent
Sakong et al.

(10) Patent No.: US 8,279,904 B2
(45) Date of Patent: Oct. 2, 2012

(54) SEMICONDUCTOR LIGHT-EMITTING DEVICE

(75) Inventors: Tan Sakong, Yongin-si (KR); Joong-kon Son, Yongin-si (KR); Ho-sun Paek, Yongin-si (KR); Sung-nam Lee, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/812,439

(22) Filed: Jun. 19, 2007

(65) Prior Publication Data

US 2007/0297474 A1    Dec. 27, 2007

(30) Foreign Application Priority Data

Jun. 23, 2006  (KR) .................. 10-2006-0057089

(51) Int. Cl.
*H01S 5/00* (2006.01)
(52) U.S. Cl. ............... 372/43.01; 372/50.1; 372/45.01; 372/46.01; 257/9; 257/14; 257/E33.008; 257/E31.033; 257/E29.069; 257/E29.316; 257/E29.072; 257/E29.248; 257/17
(58) Field of Classification Search ........... 372/43.01, 372/45.01, 46.01; 257/14, 17, 751, 9, E33.008, 257/E31.033, E29.069, E29.316, E29.072, 257/E29.248
See application file for complete search history.

(56) References Cited

U.S. PATENT DOCUMENTS

| | | | | |
|---|---|---|---|---|
| 6,233,266 B1 * | 5/2001 | Kawasumi | ............ | 372/46.01 |
| 6,437,372 B1 * | 8/2002 | Geva et al. | ............ | 257/94 |
| 6,841,409 B2 * | 1/2005 | Onishi | ............ | 438/37 |
| 2001/0017874 A1 * | 8/2001 | Ishida | ............ | 372/45 |
| 2001/0017875 A1 * | 8/2001 | Fukunaga et al. | ............ | 372/45 |
| 2003/0178631 A1 * | 9/2003 | Udagawa | ............ | 257/99 |
| 2004/0099856 A1 * | 5/2004 | Bour et al. | ............ | 257/11 |
| 2004/0222431 A1 * | 11/2004 | Flynn et al. | ............ | 257/94 |
| 2005/0082548 A1 * | 4/2005 | Sakong et al. | ............ | 257/79 |
| 2005/0127391 A1 * | 6/2005 | Yanamoto | ............ | 257/103 |
| 2006/0128046 A1 * | 6/2006 | Onishi | ............ | 438/45 |
| 2008/0012002 A1 * | 1/2008 | Sakong et al. | ............ | 257/13 |
| 2008/0023708 A1 * | 1/2008 | Akita et al. | ............ | 257/79 |

(Continued)

FOREIGN PATENT DOCUMENTS

JP   07-122812 A   5/1995

(Continued)

OTHER PUBLICATIONS

Korean Office Action dated Jul. 25, 2007 for corresponding Korean Application No. 10-2006-0057089.

(Continued)

*Primary Examiner* — Tod T Van Roy
*Assistant Examiner* — Delma R Forde
(74) *Attorney, Agent, or Firm* — Harness, Dickey & Pierce, P.L.C.

(57) ABSTRACT

A semiconductor light-emitting device including an active layer is provided. The light-emitting device includes an active layer between an n-type semiconductor layer and a p-type semiconductor layer. The active layer includes a quantum well layer formed of $In_{x_1}Ga_{(1-x_1)}N$, where $0<x_1\leq1$, barrier layers formed of $In_{x_2}Ga_{(1-x_2)}N$, where $0\leq x_2<1$, on opposite surfaces of the quantum well layer, and a diffusion preventing layer formed between the quantum well layer and at least one of the barrier layers. Due to the diffusion preventing layer between the quantum well layer and the barrier layers in the active layer, the light emission efficiency increases.

12 Claims, 3 Drawing Sheets

U.S. PATENT DOCUMENTS

2008/0089376 A1* 4/2008 Anan .................. 372/46.013
2008/0203418 A1* 8/2008 Yanamoto .................. 257/98

FOREIGN PATENT DOCUMENTS

| | | | |
|---|---|---|---|
| JP | 09298336 | * | 11/1997 |
| JP | 10-084132 A | | 3/1998 |
| JP | 10084132 | * | 3/1998 |
| JP | 2001-320135 | * | 11/2001 |
| JP | 2003-110200 A | | 4/2003 |
| JP | 2003-179261 | * | 6/2003 |
| JP | 2003-297098 A | | 10/2004 |
| JP | 2004-356256 A | | 12/2004 |
| KR | 10-0476567 B1 | | 3/2005 |
| WO | WO 2004/042832 A1 | | 5/2004 |

OTHER PUBLICATIONS

Japanese Office Action issued Jun. 5, 2012 for corresponding Japanese Appl. No. 2007-165599.

* cited by examiner

SEMICONDUCTOR LIGHT-EMITTING DEVICE

PRIORITY STATEMENT

This application claims the benefit of priority under 35 U.S.C. §119 from Korean Patent Application No. 10-2006-0057089, filed on Jun. 23, 2006, in the Korean Intellectual Property Office, the disclosure of which is incorporated herein in its entirety by reference.

BACKGROUND

1. Field

Example embodiments relate to a semiconductor light-emitting device including an active layer. Other example embodiments relate to a nitride semiconductor light-emitting device including an active layer that has a multi-quantum well structure including a quantum well layer and a barrier layer.

2. Description of the Related Art

A device including a nitride semiconductor has a high melting point and is comparatively durable against heat. As such, the device is less dependent on temperature and may been used in light-emitting devices (e.g., light-emitting diodes (blue/green light-emitting diode) and laser diodes) and high-speed switching, high-power electronic devices.

In general, compound semiconductor light-emitting devices include an active layer that converts a current to light. The active layer of a nitride semiconductor light-emitting device emitting blue light is generally formed of indium gallium nitride (InGaN). The band gap energy of the active layer is controlled by varying the composition of indium. As such, the light-emitting wavelength region can also be controlled.

An active layer of a compound semiconductor light-emitting device includes a quantum well layer and a barrier layer. The active layer has a single quantum well structure or a multi-quantum well structure.

The multi-quantum well structure includes a plurality of mini bands and can efficiently emit light at a lower current. The multi-quantum well structure has higher light-emitting power characteristics than the single quantum well structure.

An InGaN-based active layer includes a quantum well layer and a barrier layer that may have a stacked structure of InGaN/GaN and a stacked structure of InGaN/InGaN, respectively. The quantum well layer and the barrier layer may have a stacked structure of InGaN/AlGaN and a stacked structure of InGaN/InAlGaN, respectively. As the composition of indium in the InGaN-based active layer increases, the light emitting power is lower. As such, a new epitaxial technology for increasing the internal quantum efficiency of the active layer may be desirable.

SUMMARY

Example embodiments relate to a semiconductor light-emitting device including an active layer. Other example embodiments relate to a nitride semiconductor light-emitting device including an active layer that has a multi-quantum well structure including a quantum well layer and a barrier layer.

Example embodiments provide a nitride semiconductor light-emitting device having a structure that allows a higher light-emitting efficiency in a blue light wavelength region (or higher light wavelength region).

According to example embodiments, there is provided a light-emitting device including an active layer and a stacked structure including an n-type semiconductor layer and a p-type semiconductor layer on opposite surfaces of the active layer. The active layer includes a quantum well layer, barrier layers and a diffusion preventing layer. The quantum well layer is formed of $In_{x1}Ga_{(1-x1)}N$, where $0<x_1\leq 1$. The barrier layers are formed of $In_{x2}Ga_{(1-x2)}N$, where $0\leq x_2<1$. The barrier layers are formed on opposite surfaces of the quantum well layer. The diffusion preventing layer may be formed of $In_{x3}Ga_{(1-x3)}N$, where $0\leq x_3<0.01$. The diffusion preventing layer is formed between the quantum well layer and at least one (or each) of the barrier layers in order to prevent (or reduce) diffusion of indium. The amount of indium in the quantum well layer and the barrier layers of the active layer satisfies the expression $x_1>x_2$.

The quantum well layer may have a first surface and a second surface, which are opposite to each other. The diffusion preventing layer may be formed on at least one of the first and second surfaces of the quantum well layer. The diffusion preventing layer may be formed on each of the first and second surfaces of the quantum well layer.

BRIEF DESCRIPTION OF THE DRAWINGS

Example embodiments will be more clearly understood from the following detailed description taken in conjunction with the accompanying drawings.

FIG. 1 is a diagram illustrating a sectional view of a nitride semiconductor laser diode according to example embodiments;

FIG. 2 is a diagram illustrating a partially enlarged sectional view of a structure of an active layer of the nitride semiconductor laser diode in FIG. 1;

FIG. 3 is a diagram illustrating a sectional view of a structure of an active layer of a nitride semiconductor laser diode according to example embodiments; and FIG. 4 is a comparative graph of photoluminescence intensity between the nitride semiconductor laser diode of FIG. 2 and a light-emitting device according to a comparative example.

DETAILED DESCRIPTION OF EXAMPLE EMBODIMENTS

Figure 1:
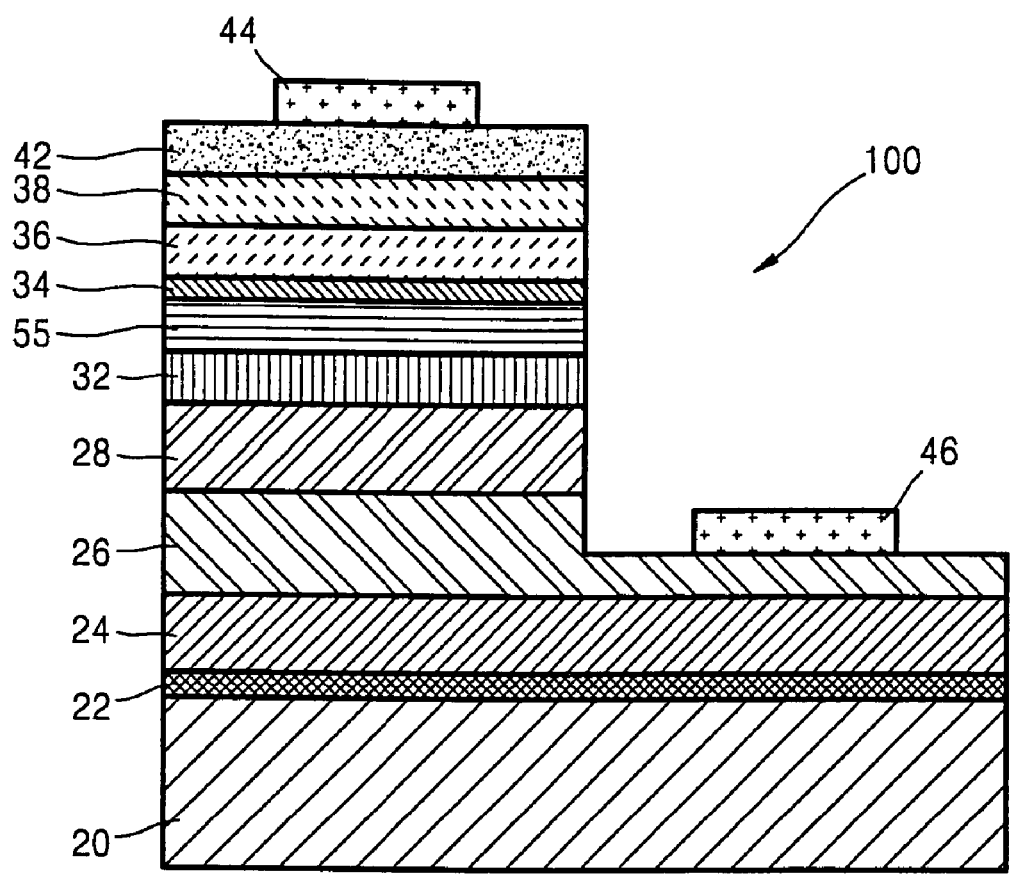
FIGS. 1-4 represent non-limiting, example embodiments as described herein.

Various example embodiments will now be described more fully with reference to the accompanying drawings in which some example embodiments are shown. In the drawings, the thicknesses of layers and regions may be exaggerated for clarity.

Detailed illustrative embodiments are disclosed herein. However, specific structural and functional details disclosed herein are merely representative for purposes of describing example embodiments. This invention may, however, may be embodied in many alternate forms and should not be construed as limited to only the example embodiments set forth herein.

Accordingly, while the example embodiments are capable of various modifications and alternative forms, embodiments thereof are shown by way of example in the drawings and will herein be described in detail. It should be understood, however, that there is no intent to limit example embodiments to the particular forms disclosed, but on the contrary, the example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of the example embodiments.

Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various aspects will be described in detail with reference to the attached drawings. However, the present invention is not limited to the example embodiments described.

Example embodiments relate to a semiconductor light-emitting device including an active layer. Other example embodiments relate to a nitride semiconductor light-emitting device including an active layer that has a multi-quantum well structure including a quantum well layer and a barrier layer.

FIG. 1 is a diagram illustrating a sectional view of a stacked structure of a nitride semiconductor laser diode according to example embodiments.

Referring to FIG. 1, a nitride semiconductor laser diode 100 includes a buffer layer 22, an n-type GaN layer 24, an n-type contact layer 26 and an n-type electrode 46, which are sequentially formed on a substrate 20. The n-type contact layer 26 includes a first region where the n-type electrode 46 is formed and a second region where an n-type cladding layer 28 is formed. In the first region where the n-type electrode 46 is formed, the n-type contact layer 26 is over-etched to be lower than the second region where the n-type cladding layer 28 is formed.

An n-type optical waveguide layer 32, an active layer 55, a carrier barrier layer 34, a p-type optical waveguide layer 36, a p-type cladding layer 38 and a p-type contact layer 42 are sequentially formed on the n-type cladding layer 18. A p-type electrode 44 is formed on the p-type contact layer 42.

In the nitride semiconductor laser diode 100 having the above-describe structure according to example embodiments, the carrier barrier layer 34 is formed between the active layer 55 and the p-type optical waveguide layer 36 to protect the active layer 55 and prevent p-type impurities in the p-type optical waveguide layer 36 from diffusing into the active layer 55.

A method of manufacturing the nitride semiconductor laser diode 100 will be described below. While the following description is directed to a laser diode, example embodiments are not limited thereto. One of ordinary skill in the art should appreciate that the method may be used to manufacture a semiconductor light-emitting device according to example embodiments.

The buffer layer 22 is grown (or formed) on the substrate 10 using a low-temperature growing method. The n-type GaN layer 24 is grown (or formed) on the buffer layer 22 at a relatively high temperature. The n-type contact layer 26 realizes (or forms) an ohmic contact with the n-type electrode 46. The n-type cladding layer 28 and the n-type optical waveguide layer 32 allow carriers to be confined in the active layer 55. The n-type contact layer 26, the n-type cladding layer 28 and the n-type optical waveguide layer 32 are sequentially formed on the n-type GaN layer 24.

The active layer 55 having a multi-quantum well structure, which emits light by injecting (or supplying) currents, and the carrier barrier layer 34, which protects the active layer 55 and prevents (or reduces the likeliness of) p-type impurities from diffusing into the active layer 55, are formed on the n-type optical waveguide layer 32. The p-type optical waveguide layer 36, the p-type cladding layer 38 and the p-type contact layer 42 are sequentially formed on the carrier barrier layer 34.

In the above-described structure, in order to increase the light-emitting power or reduce internal light absorption, layers are formed on the substrate 20, the buffer layer 22, and the n-type GaN layer 24 and selectively removed (e.g., by etching).

Figure 2:
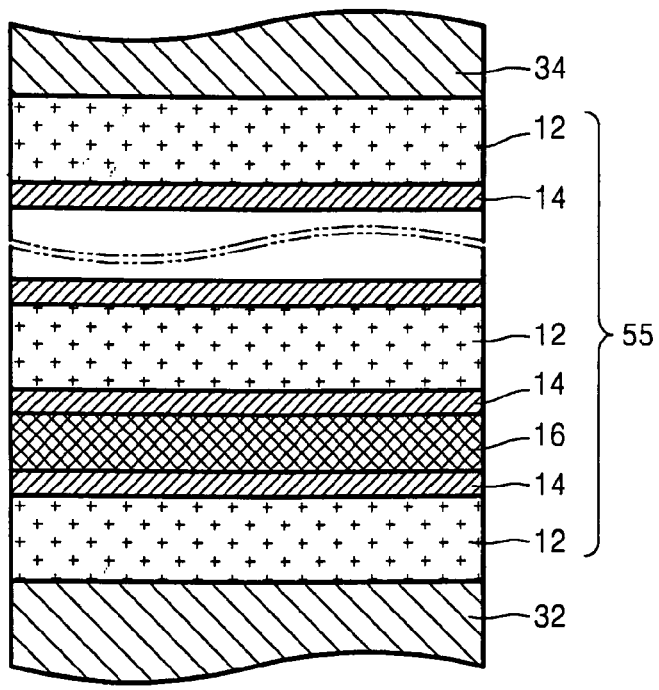

FIG. 2 is a diagram illustrating an enlarged sectional view of a stacked structure of the active layer 55 in the nitride semiconductor laser diode 100 in FIG. 1.

Referring to FIG. 2, the active layer 55 includes a quantum well layer 16, barrier layers 12 formed on and below the quantum well layer, and diffusion preventing layers 14 formed between the quantum well layer 16 and the barrier layers to prevent diffusion of indium from the barrier layers 12.

The quantum well layer 16 has a first surface and a second surface, which are opposite each other. The diffusion preventing layers 14 may be formed on the first and second surfaces of the quantum well layer 16.

The active layer 55 has a multi-quantum well structure including a desired number of structures each including the quantum well layer 16, the diffusion preventing layers 14 and the barrier layer 12 between the diffusion preventing layers 14.

A light-emitting diode, which is a type of light-emitting device, uses direct light spontaneously emitted from the active layer. A laser diode emits light having a desired wavelength band by stimulated emission from the light spontaneously emitted from the active layer. In the laser diode utilizing the stimulated emission, the light emitting efficiency of the active layer affects characteristics of the light-emitting device.

In order to increase the light emitting efficiency of the active layer, the active layer 55 is formed as a multi-quantum well structure which is based on the concept of band gap engineering and in which the amount of indium in InGaN is taken into consideration.

If the quantum well layer 16 and the barrier layer 12 of the active layer 15 are formed of InGaN and GaN, respectively, based on the concept of band gap engineering and because GaN has a larger energy band gap than InGaN, then carriers may be more effectively confined in the quantum well layer 16. Because the quantum well layer 16 formed of InGaN including a larger amount of indium grows at a temperature of 800° C. or less, the crystallinity of the GaN barrier layer 12 is not ensured.

In a multi-quantum well structure including a plurality of InGaN/GaN stacked structures, the light emitting efficiency increases in proportion to the number of crystal defects (e.g., pits) occurring in the GaN barrier layer of the multi-quantum well structure rather than being proportional to the number of stacked structures. In other words, the light emission of the active layer is limited by the number of crystal defects. If growing a p-type GaN barrier layer, magnesium (Mg) dopants diffuse into the pits in the active layer. As such, the boundary between the final GaN barrier layer and a p-n junction of the p-type GaN nitride semiconductor becomes indistinct. If the Mg dopants which have diffused into the pits further diffuse into the quantum well layer, then the light-emitting efficiency deteriorates and the optical efficiency and the reliability decrease.

If the InGaN quantum well layer and the GaN barrier layer are used in an active layer of a laser diode, then the quantum well layer experiences strain due to a difference in crystalline structure between the barrier layer and the quantum well layer. The strain alters (or affects) the photoelectric conversion efficiency in the active layer and the laser gain. In an active layer stacked on a c-plane GaN having a crystalline polarity, a piezo-electric field is generated due to the strain. The piezo-electric field leads to a difference between the wavelength of spontaneously emitted light and the wavelength of light emitted by stimulation, making effective laser oscillation more difficult.

As such, the quantum well layer and the barrier layer of the active layer are formed of InGaN materials including different amounts of indium. In a laser diode emitting light in a wavelength of 400 nm-600 nm, the amounts of indium in the active layer and the barrier layer may vary in the range of 1%-10%. For example, in order to emit light having a wavelength of 450 nm-530 nm, the amount of indium in the quantum well layer may be in the range of 16%-20%. The amount of indium in the barrier layer may be in the range of 1%-5% in proportion to the amount of indium in the quantum well layer.

If the quantum well layer and the barrier layer have different crystalline compositions as described above, then a strain occurs at the interface between the quantum well layer and the barrier layer, affecting the operating characteristics of the laser diode. If the amount of indium in the quantum well layer increases, then the InGaN layer is crystallographically and chemically unstable. As such, a new material layer, which is not intended, may be generated (or formed) at the interface between the quantum well layer and the barrier layer due to the inter-diffusion of indium therebetween in a p-type semiconductor layer forming process performed at a higher temperature. The new material layer may absorb light emitted by stimulation, making the quantum well layer and the barrier layer structurally unstable and lowering the light emitting efficiency.

According to example embodiments, the diffusion preventing layers 14 are interposed between the quantum well layer 16 and the barrier layers 12 to prevent (or reduce the likeliness of) indium from diffusing between the quantum well layer and the barrier layer. The diffusion preventing layers 14 also prevent (or reduce) the deterioration of interfacial characteristics between the two layers. The diffusion preventing layers 14 may be formed of $In_{x3}Ga_{(1-x3)}N$ ($0 \leq x_3 < 0.01$) (e.g., GaN) in order to increase the light emission effect.

Each of the diffusion preventing layers 14 may have a thickness of 0.2 nm-6 nm. The diffusion preventing layers 14 may have an energy band gap that is larger than an energy band gap of the quantum well layer 16. The diffusion preventing layers 14 may have an energy band gap equal to or larger than the barrier layer 12.

Figure 3:
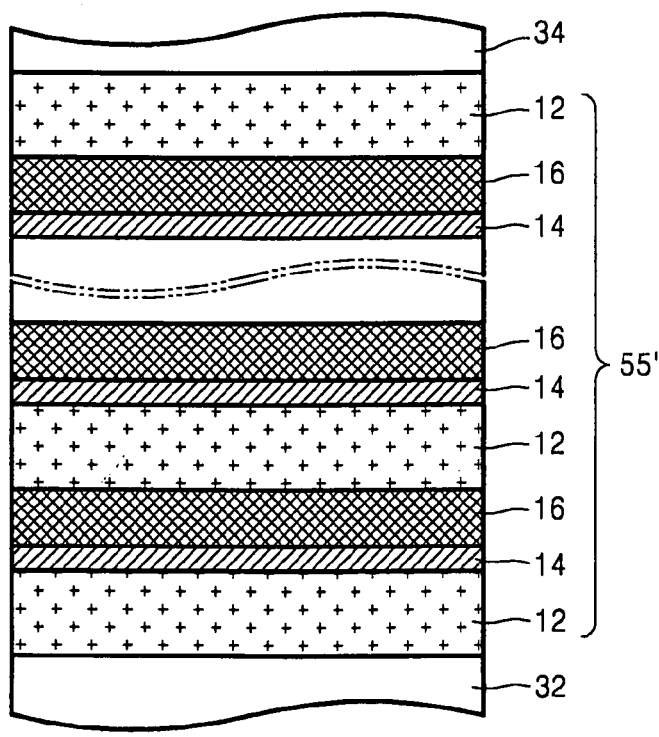

FIG. 3 is a diagram illustrating a sectional view of a structure of an active layer 55' of a laser diode according to example embodiments. The laser diode according to example embodiments has the same structure as the laser diode of FIG. 1, except for the structure of the active layer 55'.

Referring to FIG. 3, diffusion preventing layers 14 are formed only on one surface of the barrier layers 12 on both sides of the quantum well layer 16. The quantum well layer 16 has a first surface and a second surface, which are opposite each other. The diffusion preventing layer 14 may be formed only on the second surface of the quantum well layer 16.

The active layer 55' of the laser diode of FIG. 3 has a stacked structure including repeatedly formed layers (e.g., a barrier layer 12, a quantum well layer 16, a diffusion preventing layer 14, a barrier layer 12, a quantum well layer 16, a diffusion preventing layer 14 and a barrier layer 12) which are sequentially stacked upon each other.

If the diffusion preventing layer 14 is formed only on the second surface of the wall layer 16 as shown in FIG. 3, then a light-emitting device having a higher light-emitting efficiency in a blue wavelength region (or higher wavelength region) may be manufactured.

Figure 4:
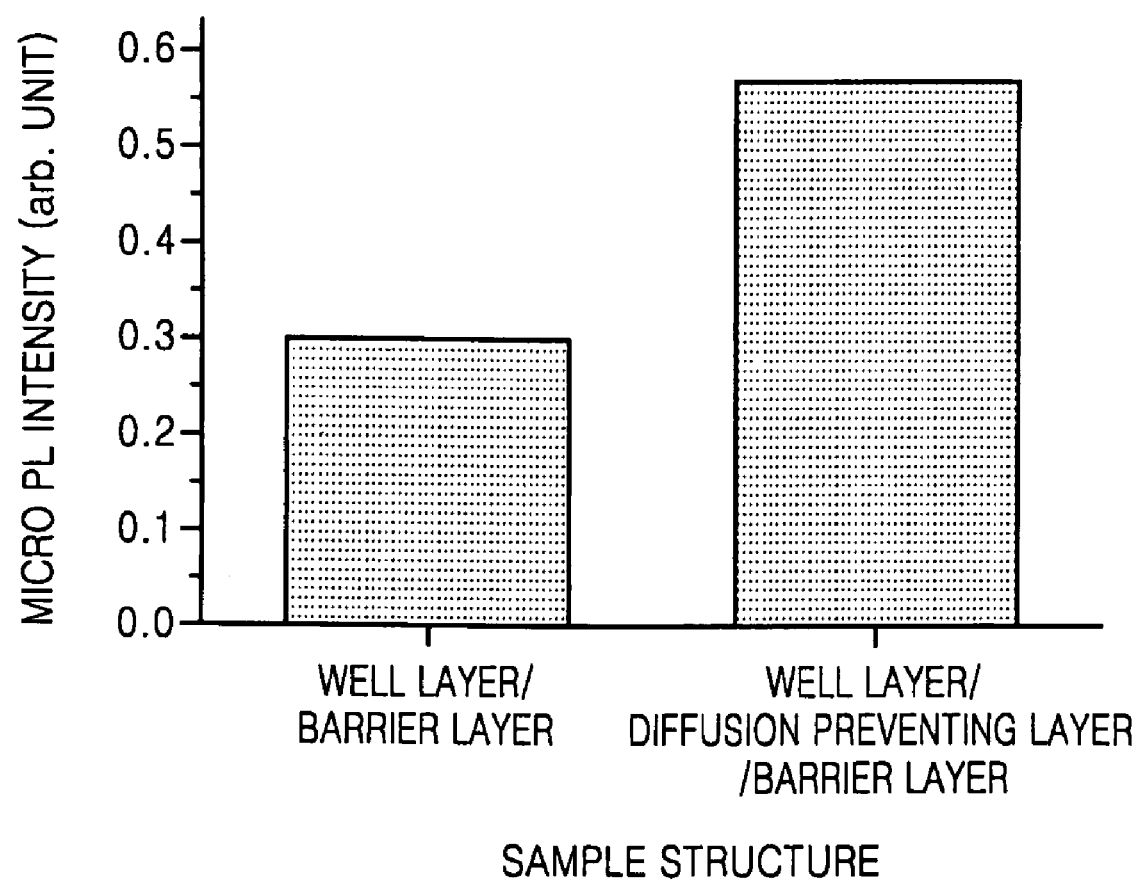

FIG. 4 is a comparative graph of photoluminescence (PL) intensity between the nitride semiconductor laser diode of FIGS. 1 and 2 according to example embodiments in an intermediate state and a light-emitting device according to a comparative example.

In the nitride semiconductor light-emitting device of FIG. 2, the active layer has a multi-quantum well structure including a quantum well layer 16, a diffusion preventing layer 14, the barrier layer 12 and a diffusion preventing layer 14, which are sequentially and repeatedly formed. The quantum well layer 16 is formed of $In_{x1}Ga_{(1-x1)}N$ ($x_1=0.16$), which includes 16% of indium and has a thickness of 20 Å-25 Å. The barrier layer 12 is formed of $In_{x2}Ga_{(1-x2)}N$ ($x_2=0.02$), which includes 2% of indium, and has a thickness of 150 Å. The barrier layer 12 is formed on the quantum well layer 16. The diffusion preventing layer 14 is formed of GaN between the quantum well layer 16 and the barrier layer 12 to a thickness of 15 Å.

The light-emitting device according to the comparative example includes an active layer having a multi-quantum well structure in which a quantum well layer and a barrier layer are repeatedly formed. The quantum well layer and the barrier layer are formed of the same compositions and with the same thicknesses as the respective layers shown in FIG. 2.

Referring to FIG. 4, the PL intensity of the device, which according to example embodiments has the active layer structure including the diffusion preventing layer between the quantum well layer and barrier layer, is about 50% higher than the PL intensity of the light-emitting device having the active layer structure including a multi-stack of only the quantum well layer and the barrier layer.

Although the above example embodiments are described with reference to a laser diode, the light-emitting device according to example embodiments is not limited to the laser diode and may be implemented (or used) as a light-emitting diode, a super luminescent diode (SLD) or similar device.

As described above, a light-emitting device according to example embodiments includes an active layer in which a diffusion preventing layer is interposed between adjacent well layer and barrier layer, forming a device having higher photoelectric conversion efficiency.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A light-emitting device, comprising:
an active layer having a quantum well layer, barrier layers on opposite surfaces of the quantum well layer, and diffusion preventing layers each formed between the quantum well layer and at least one of the barrier layers in order to prevent diffusion of indium, wherein the diffusion preventing layers have a thickness of 0.2 nm-6 nm;
a stacked structure including an n-type semiconductor layer including a n-type cladding layer and a n-type optical waveguide layer, and a p-type semiconductor layer including a p-type optical waveguide layer and a p-type cladding layer on opposite surfaces of the active layer; and
a carrier barrier layer between the active layer and the p-type semiconductor layer to prevent diffusion of an p-type impurity from the p-type semiconductor layer into the active layer,
wherein the diffusion preventing layers are formed between the quantum well layer and each of the barrier layers,
the quantum well layer is formed of $In_{x1}Ga_{(1-x1)}N$, where the expression $0<x_1\leq1$ is satisfied,
the barrier layers are formed of $In_{x2}Ga_{(1-x2)}N$, where the expressions $0\leq x_2 <1$ and $x_1>x_2$ are satisfied, and
the diffusion preventing layers are formed of $In_{x3}Ga_{(1-x3)}N$, where the expression $0\leq x_3<0.01$ is satisfied.

2. The light-emitting device of claim 1, wherein the diffusion preventing layers are formed on each surface of the quantum well layer.

3. The light-emitting device of claim 1, wherein the active layer has a multi-quantum well structure in which the quantum well layer, the diffusion preventing layers, and the barrier layers are repeatedly formed.

4. The light-emitting device of claim 1, wherein the diffusion preventing layers are formed on only one surface of the quantum well layer.

5. The light-emitting device of claim 1, wherein diffusion preventing layers are formed on each surface of the quantum well layer.

6. The light-emitting device of claim 1, wherein the device is a laser diode.

7. The laser diode of claim 6, wherein the quantum well layer is formed of $In_{x1}Ga_{(1-x1)}N$, where the expression $0.16\leq x_1\leq0.20$ is satisfied, the barrier layers are formed of $In_{x2}Ga_{(1-x2)}N$, where the expression $0.01\leq X_2\leq0.04$ is satisfied; and the diffusion preventing layers are formed of $In_{x3}Ga_{(1-x3)}N$, where the expression $0\leq x_3<0.01$ is satisfied.

8. The laser diode of claim 7, wherein the diffusion preventing layers are formed of GaN.

9. The laser diode of claim 7, wherein the active layer has a multi-quantum well structure in which the quantum well layer, the diffusion preventing layers, and the barrier layers are repeatedly formed.

10. The laser diode of claim 7, wherein the diffusion preventing layers are formed on only one surface of the quantum well layer.

11. The laser diode of claim 7, wherein diffusion preventing layers are formed on each surface of the quantum well layer.

12. The laser diode of claim 7, wherein the active layer emits light having a wavelength of 400 nm-600 nm.

* * * * *